United States Patent
Kim

(10) Patent No.: US 11,996,712 B2
(45) Date of Patent: May 28, 2024

(54) SERIES-TYPE CHARGING AND DISCHARGING APPARATUS WITHOUT CURRENT INTERRUPTION

(71) Applicant: HBL CORPORATION, Daejeon (KR)

(72) Inventor: Jeong Moog Kim, Daejeon (KR)

(73) Assignee: HBL CORPORATION, Daejeon (KR)

(*) Notice: Subject to any disclaimer, the term of this patent is extended or adjusted under 35 U.S.C. 154(b) by 0 days.

(21) Appl. No.: 18/269,965

(22) PCT Filed: Apr. 7, 2021

(86) PCT No.: PCT/KR2021/004316
§ 371 (c)(1),
(2) Date: Jun. 28, 2023

(87) PCT Pub. No.: WO2022/145581
PCT Pub. Date: Jul. 7, 2022

(65) Prior Publication Data
US 2023/0396081 A1    Dec. 7, 2023

(30) Foreign Application Priority Data

Dec. 29, 2020 (KR) .......................... 10-2020-0185443
Feb. 22, 2021 (KR) .......................... 10-2021-0023312

(51) Int. Cl.
*H02J 7/00*    (2006.01)
*H02J 1/04*    (2006.01)
*H02J 1/10*    (2006.01)

(52) U.S. Cl.
CPC .............. *H02J 7/0018* (2013.01); *H02J 1/04* (2013.01); *H02J 1/102* (2013.01); *H02J 1/106* (2020.01);
(Continued)

(58) Field of Classification Search
CPC ..................................................... H02J 7/0018
(Continued)

(56) References Cited

U.S. PATENT DOCUMENTS 6,380,715 B1 * 4/2002 Kubo .................... H01M 10/44
320/128
7,940,032 B2 * 5/2011 Kim ......................... G05F 1/67
323/283
(Continued)

FOREIGN PATENT DOCUMENTS

GB          2308025    *  6/1997
JP          2013158190    8/2013
(Continued)

OTHER PUBLICATIONS

"Office Action of Korea Counterpart Application", issued on May 11, 2021, with English translation thereof, p. 1-p. 8.
(Continued)

*Primary Examiner* — Yalkew Fantu
(74) *Attorney, Agent, or Firm* — JCIPRNET

(57) ABSTRACT

The present disclosure relates to a method and an apparatus for charging and discharging a plurality of secondary batteries connected in series by using one bi-directional main charging and discharging power supply, and more particularly, to a series-type charging and discharging method and apparatus without current interruption in which auxiliary charging power supplies are added in parallel to individual batteries to reduce a capacity difference between the individual batteries and perform continuous charging and discharging according to a predetermined recipe (electrical conditions for charging and discharging, etc.) without interruption (on/off) of a charging and discharging current of the main charging and discharging power supply.

9 Claims, 4 Drawing Sheets

(52) U.S. Cl.
CPC ....... *H02J 7/00712* (2020.01); *H02J 2207/20* (2020.01)

(58) Field of Classification Search
USPC .......................................................... 320/128
See application file for complete search history.

(56) References Cited

U.S. PATENT DOCUMENTS

| | | | | |
|---|---|---|---|---|
| 2011/0175451 A1* | 7/2011 | Moon | ..................... | H02J 9/062 307/66 |
| 2019/0097434 A1* | 3/2019 | Kim | ................... | H01M 10/425 |

FOREIGN PATENT DOCUMENTS

| | | | |
|---|---|---|---|
| KR | 1020060093343 | | 8/2006 |
| KR | 1020140014226 | | 2/2014 |
| KR | 1020140029017 | | 3/2014 |
| KR | 101397887 | | 5/2014 |
| KR | 101451009 | | 10/2014 |
| KR | 101470735 | | 12/2014 |
| KR | 20180051786 | * | 5/2018 |
| KR | 1020180051732 | | 5/2018 |
| KR | 1020180051786 | | 5/2018 |
| KR | 1020180082345 | | 7/2018 |
| KR | 102120797 | | 6/2020 |
| WO | 2005041383 | | 5/2005 |
| WO | 2012120030 | | 9/2012 |
| WO | 2013114696 | | 8/2013 |

OTHER PUBLICATIONS

"Notice of Allowance of Korea Counterpart Application", issued on Jun. 1, 2021, with English translation thereof, p. 1-p. 4.

* cited by examiner

SERIES-TYPE CHARGING AND DISCHARGING APPARATUS WITHOUT CURRENT INTERRUPTION

TECHNICAL FIELD

One or more embodiments relate to a method and an apparatus for charging and discharging a plurality of secondary batteries connected in series using one bi-directional main charging and discharging power supply, and more particularly, to a series-type charging and discharging method and apparatus without current interruption in which auxiliary charging power supplies are added in parallel to individual batteries to reduce a capacity difference between the individual batteries and perform continuous charging and discharging according to a predetermined recipe without interruption (on/off) of a charging and discharging current of the main charging and discharging power supply.

BACKGROUND ART

In a process of manufacturing and using secondary batteries (generic term for batteries such as lithium batteries which are used by being repeatedly charged and discharged), the secondary batteries are charged and discharged according to a predetermined recipe (electrical conditions for charging and discharging, etc.).

Since good or bad decision for batteries is made and batteries are sorted according to a result of charge and discharge operation characteristics, a charging and discharging process is a very important process in a secondary battery manufacturing process.

With an explosive increase in production of large-capacity secondary batteries for electric vehicles, a huge increase in equipment costs as well as electric power consumed in an operation process and accompanying air cooling and heating are important matters that affect the economic feasibility of secondary batteries, and at the same time, in order to improve the safety of secondary batteries in a charging and discharging process, charging and discharging apparatuses are also required to have measurement and inspection functions.

Secondary batteries have characteristics in which a voltage and a current vary according to a charge and discharge power amount. In a common charging recipe, first, when constant current charging is performed at a predetermined current, a voltage of a battery is gradually increased to reach a predetermined setting voltage (or a maximum voltage), and then, while the predetermined setting voltage is maintained, when a charging current is gradually decreased to reach a predetermined setting current (or a cutoff current), a charging process is completed.

In a common discharging recipe, when a battery is discharged at a predetermined constant current, a voltage of the battery is gradually decreased, and when the voltage reaches a predetermined setting voltage (or a cutoff voltage), a discharging process is completed.

Even when batteries with large battery capacity among secondary batteries are charged and discharged at the same current, a voltage fluctuation is low, and in a case in which a plurality of batteries connected in series are charged and discharged, when there is no device that corrects for a capacity difference between the batteries, there is a problem that charging and discharging according to a charging and discharging recipe is impossible.

In order to connect a plurality of secondary batteries in series or separate each of the plurality of secondary batteries from a circuit, a relay switch is inevitably used in the circuit. When a battery of which a charging and discharging process has been completed first is to be separated from the circuit, a current of a main charging and discharging power supply is temporarily interrupted (on/off) at a moment when the relay switch operates, which may cause errors in current and voltage measurement.

In order to maintain high precision and resolution, high specification sensors (that are generally expensive) are used as voltage and current sensors of apparatuses for charging and discharging a plurality of secondary batteries connected in series, and are periodically calibrated.

The safety issue of apparatuses for charging and discharging secondary batteries is a very important issue, and a function of detecting major risk factors in real time is very important in terms of apparatus safety.

During an operation of charging and discharging apparatuses, there may be problems such as heat generation or deformation of batteries themselves, and a voltage drop or heat generation due to contact failure at electrodes of batteries are the most frequently occurring risk factors.

Apparatuses for charging and discharging secondary batteries are usually unmanned automated equipment, and an operation program has to be improved or upgraded if necessary. However, when there are a great number of pieces of equipment operated at a high voltage and a high current, there is a problem that it is difficult to modify or upgrade a control program.

DISCLOSURE

Technical Problem

An object of the present disclosure is to provide a series-type charging and discharging method and apparatus automatically controlled without current interruption, in which a plurality of secondary batteries connected in series are charged and discharged using one bi-directional main charging and discharging power supply without a charging or discharging current interruption (on/off) phenomenon of a battery to reduce the number of charging and discharging apparatuses to one, thereby reducing equipment costs and operation costs.

Another object of the present disclosure is to provide a series-type charging and discharging method and apparatus automatically controlled without current interruption in which, since a plurality of secondary batteries connected in series are charged and discharged using one bi-directional main charging and discharging power supply without a charging or discharging current interruption (on/off) phenomenon of a battery, an operating voltage of the main charging and discharging power supply is n times higher than a voltage of one battery, wherein n is the number of batteries, thereby reducing equipment costs and operation costs.

Still another object of the present disclosure is to provide a series-type charging and discharging method and apparatus automatically controlled without current interruption, in which a plurality of secondary batteries connected in series are charged and discharged using one bi-directional main charging and discharging power supply without a charging or discharging current interruption (on/off) phenomenon of a battery, and an auxiliary charging power supply is added in parallel to each of a plurality of individual batteries connected in series to correct a capacity difference between the individual batteries.

Yet another object of the present disclosure is to provide a series-type charging and discharging method and apparatus automatically controlled without current interruption, in which an auxiliary charging power supply provided for the purpose of correcting a capacity difference between individual batteries is configured as an insulated unidirectional DC-to-DC converter that uses a power source of a DC grid, which is an input terminal of a main charging and discharging power supply or separate external power supply as an input, and uses a voltage of the individual battery as an output.

Yet another object of the present disclosure is to provide a series-type charging and discharging method and apparatus automatically controlled without current interruption in which, by using a series-type charging and discharging method and apparatus in which a plurality of secondary batteries are connected in series, a general specification current sensor of individual batteries may be periodically and automatically calibrated according to a high specification current sensor of a main charge and discharge power supply, thereby reducing manufacturing costs.

Yet another object of the present disclosure is to provide a series-type charging and discharging method and apparatus in which a change in gain value, an offset value, and a drift value of a general specification current sensor of an individual battery, which are generally caused by long-term operation, are periodically and precisely calibrated, thereby allowing low-cost general specification current sensors to exhibit the same or similar characteristics as the performance of high specification current sensors.

Yet another object of the present disclosure is to provide a series-type charging and discharging method and apparatus in which, since a function is added to compare an output voltage of a main charging and discharging power supply with the sum of voltages of individual batteries in real time, it is possible to check an abnormality of a contact portion including the individual batteries in real time to recognize a potential difference in which heat generation is expected in real time and prevent accidents in advance, thereby improving the safety of the charging and discharging power supply as compared with an existing method of determining the possibility of an accident with a state of heat generation.

Yet another object of the present disclosure is to provide a series-type charging and discharging method and apparatus in which, when a control program of the series-type charging and discharging apparatus is to be modified or upgraded, without modifying or upgrading of a program of a charging and discharging controller of individual batteries, a program of only controllers of main charging and discharging power supplies, of which the number is considerably less than the number of individual batteries, may be modified or upgraded through remote communication, thereby considerably improving ease of follow-up management of equipment.

Technical Solution

A technical solution of the present disclosure is to provide a method and apparatus for charging and discharging a plurality of secondary batteries connected in series using one bi-directional main charging and discharging power supply and is to provide a series-type charging and discharging method and apparatus without current interruption in which auxiliary charging power supplies are added in parallel to individual batteries to correct and reduce a capacity difference between the individual batteries and perform continuous charging and discharging according to a predetermined charging and discharging recipe without a charging or discharging current interruption (on/off) of the main charging and discharging power supply.

Another technical solution of the present disclosure is to provide a series-type charging and discharging method and apparatus without current interruption in which an auxiliary charging power supply is configured as an insulated unidirectional switch mode DC-to-DC converter that uses a power source of a DC grid, which is an input terminal of a main charging and discharging power supply or one of separate DC power and AC power as an electrical input of the auxiliary charging power supply and uses a voltage of an individual battery as an output, and a voltage and current of the individual battery are increased or decreased by using the auxiliary charging power supply including a separate controller that includes a microcontroller.

Still another technical solution of the present disclosure is to provide a series-type charging and discharging method and apparatus without current interruption in which, during series charging or serial charging, when a main charging and discharging power supply performs charging at a predetermined constant current according to a predetermined charging recipe, a voltage of a "battery with the smallest capacity" first reaches a predetermined setting voltage (or a maximum voltage, for example, 4,200 mV in a lithium battery), and the main charging and discharging power supply performs constant voltage charging (at a charging current according to a predetermined recipe) based on the "battery with the smallest capacity," and for other batteries with larger capacity than the battery with the smallest capacity, a deficit charging current is supplemented using an auxiliary charging power supply according to a predetermined charging recipe to complete charging of all individual batteries according to a predetermined charging recipe without current interruption (on/off).

Yet another technical solution of the present disclosure is to provide a series-type charging and discharging method and apparatus without current interruption in which an auxiliary charging power supply provided for the purpose of correcting a capacity difference between individual batteries is an insulated unidirectional DC-to-DC converter that uses a power source of a DC grid, which is an input terminal of a main charging and discharging power supply, or separate external power as an input and uses a voltage of the individual battery as an output, and the auxiliary charging power supply performs a function of supplementing a charging current for a battery with large capacity in a charging process of batteries connected in series according to the present disclosure and performs a function of supplementing a discharging current for a battery with small capacity in a discharging process thereof.

Yet another technical solution of the present disclosure is to provide a series-type charging and discharging method and apparatus automatically controlled without current interruption in which an auxiliary charging power supply performs a function of supplementing a charging current for a battery with large capacity in a charging process of batteries connected in series and performs a function of supplementing a discharging current for a battery with small capacity in a discharging process thereof, the auxiliary charging power supply is configured as a high-frequency switching power supply and has a configuration in which a control program provided according to the present disclosure is loaded in a memory and executed by a microprocessor to perform precise control and minimize power loss, and the auxiliary charging power supply is automatically controlled according to a charging and discharging recipe and/or a charging and discharging profile according to the present disclosure and is configured to perform a charging and discharging operation.

Yet another technical solution of the present disclosure is to provide a series-type charging and discharging method and apparatus automatically controlled without current interruption in which a calibration operation of calibrating a current sensor of a charging and discharging power supply is periodically and automatically performed under predetermined conditions during a charging and discharging operation according to a high specification current sensor of a main charging and discharging power supply, the main charging and discharging power supply is configured to precisely recognize an output voltage and current and concurrently perform charging and discharging while exchanging charging and discharging data with a microprocessor in which a control program is loaded and which is for controlling individual batteries, and when a difference between the sum of voltage values of the individual batteries and an output voltage of the main charging and discharging power supply is recognized as a setting value or more, it is recognized that an abnormality occurs in a series-type charging and discharging circuit.

Yet another technical solution of the present disclosure is to provide a series-type charging and discharging method and apparatus automatically controlled without current interruption in which it is ideal when an output voltage of a main charging and discharging power supply should be the same as the sum of voltages of individual batteries connected in series or should be higher than the sum of voltages of individual batteries connected in series by the amount of a voltage drop at a contact portion (usually several mV or less per individual battery), but in a case in which poor contact occurs in a battery contact portion or a relay contact portion, when a voltage difference is detected as higher than a setting (predetermined) value or more, in the case, an operation of equipment is stopped, and an warning message is generated and notified so as to take safety precautions.

Yet another technical solution of the present disclosure is to provide a series-type charging and discharging method and apparatus automatically controlled without current interruption in which, since an apparatus for charging and discharging a secondary battery usually handles a very large number of batteries (more than tens of thousands of batteries), it is not easy to modify or upgrade an operation program of a control device, but in the present disclosure, programs of controllers (one-several tenth of the number of batteries) of main charging and discharging power supplies, which control series-type charging and discharging apparatuses, are easily modified or upgraded through remote communication (for example, Ethernet or the like).

Advantageous Effects

According to the present disclosure, when a plurality of secondary batteries connected in series are charged and discharged using one main charging and discharging power supply, there is an enhanced effect of reducing equipment costs due to simplification of equipment, and since an operating voltage of the main charging and discharging supply is n times higher than a voltage of one battery, wherein n is the number of batteries, power conversion efficiency is increased, thereby obtaining an enhanced effect of reducing operation costs.

As another effect of the present disclosure, as an improvement required in a common series-type charging and discharging apparatus, there is an advantageous effect of resolving a risk of a main charging or discharging current interruption (on/off) phenomenon due to the interruption of a relay switch and resulting measurement errors of voltage and current.

As still another effect of the present disclosure, in a charging and discharging process in which a plurality of secondary batteries are connected in series, since there is no current separation between batteries by a relay switch or the like before a charging and discharging cycle of all batteries is completed, there is no interruption of a main charging or discharging current, and a change in output voltage of a main charging and discharging power supply is small. Thus, the main charging and discharging power supply may operate only under conditions of high operating efficiency, thereby improving power efficiency and reducing operation costs.

As yet another effect of the present disclosure, a control program designed and manufactured to be controlled according to a charging and discharging recipe and/or charging and discharging profile provided according to the present disclosure is loaded in the apparatus and the apparatus is precisely controlled by a microprocessor executing the control program, thereby obtaining an enhanced effect of automatically controlling charging and discharging while minimizing power loss.

As yet another effect of the present disclosure, since a series-type charging and discharging method is used in which a plurality of secondary batteries are connected in series, according to a high specification current sensor of a main charging and discharging power supply, a general specification current sensor of an individual battery may be periodically and automatically calibrated, thereby obtaining an enhanced effect of reducing manufacturing costs.

A change in gain value, an offset value, and a drift value of a general specification current sensor of an individual battery, which are generally caused by long-term operation, are periodically and precisely corrected according to a high specification current sensor, thereby allowing low-cost general specification current sensors to exhibit the same or similar characteristics as high specification current sensors.

As yet another effect of the present disclosure, since a function is added to compare an output voltage of a main charging and discharging power supply with the sum of voltages of individual batteries in real time, it is possible to check an abnormality of a contact portion including the individual batteries in real time, thereby obtaining an advantageous effect of improving the safety of the charging and discharging power supply as compared with an existing method of determining the possibility of an accident with a state of heat generation. It is possible to recognize a potential difference in which heat generation is expected in real time, thereby obtaining an enhanced effect of preventing accidents in advance.

As yet another effect of the present disclosure, when a control program of a series-type charging and discharging apparatus is to be modified or upgraded, without modifying or upgrading a program of a charging and discharging controller of individual batteries, only programs of controllers of main charging and discharging power supplies, of which the number is considerably less than the number of batteries, may be modified or upgraded through remote communication, thereby obtaining an enhanced effect of considerably improving ease of follow-up management of equipment.

BEST MODE

The best mode of the present disclosure is to provide a method and apparatus for charging and discharging a plurality of secondary batteries connected in series using one bi-directional main charging and discharging power supply and is to provide a series-type charging and discharging method and apparatus without current interruption in which auxiliary charging power supplies are added in parallel to individual batteries to correct and reduce a capacity difference between the individual batteries and perform continuous charging and discharging according to a predetermined charging and discharging recipe without interruption (on/off) of a charging and discharging current of the main charging and discharging power supply.

In addition, another technical solution of the present disclosure is to provide a charging and discharging method and apparatus without current interruption in which an auxiliary charging power supply is configured as an insulated unidirectional switch mode DC-to-DC converter that uses a power source of a DC grid, which is an input terminal of a main charging and discharging power supply or one of separate DC power and AC power as an electrical input of the auxiliary charging power supply and uses a voltage of an individual battery as an output, and a voltage and current of the individual battery are increased or decreased using the auxiliary charging power supply including a separate controller that includes a microcontroller.

MODE FOR INVENTION

The specific details of various forms for carrying out the present disclosure will be described.

The present disclosure relates to a series-type charging and discharging method and apparatus without current interruption in which a plurality of secondary batteries connected in series are charged and discharged using one bi-directional main charging and discharging power supply.

In addition, the present disclosure relates to a series-type charging and discharging method and apparatus without current interruption in which a plurality of individual batteries connected in series to a bi-directional main charging and discharging power supply to be charged and discharged may have a capacity difference, and in order to correct the capacity difference between the individual batteries, an auxiliary charging power supply may be additionally installed in parallel to each of the individual batteries, thereby perform precise control such that supplementation (correction) is possible.

Specific embodiments of the present disclosure will be described.

EMBODIMENTS

Specific embodiments according to the present disclosure will be described with reference to the accompanying drawings.

Figure 1:
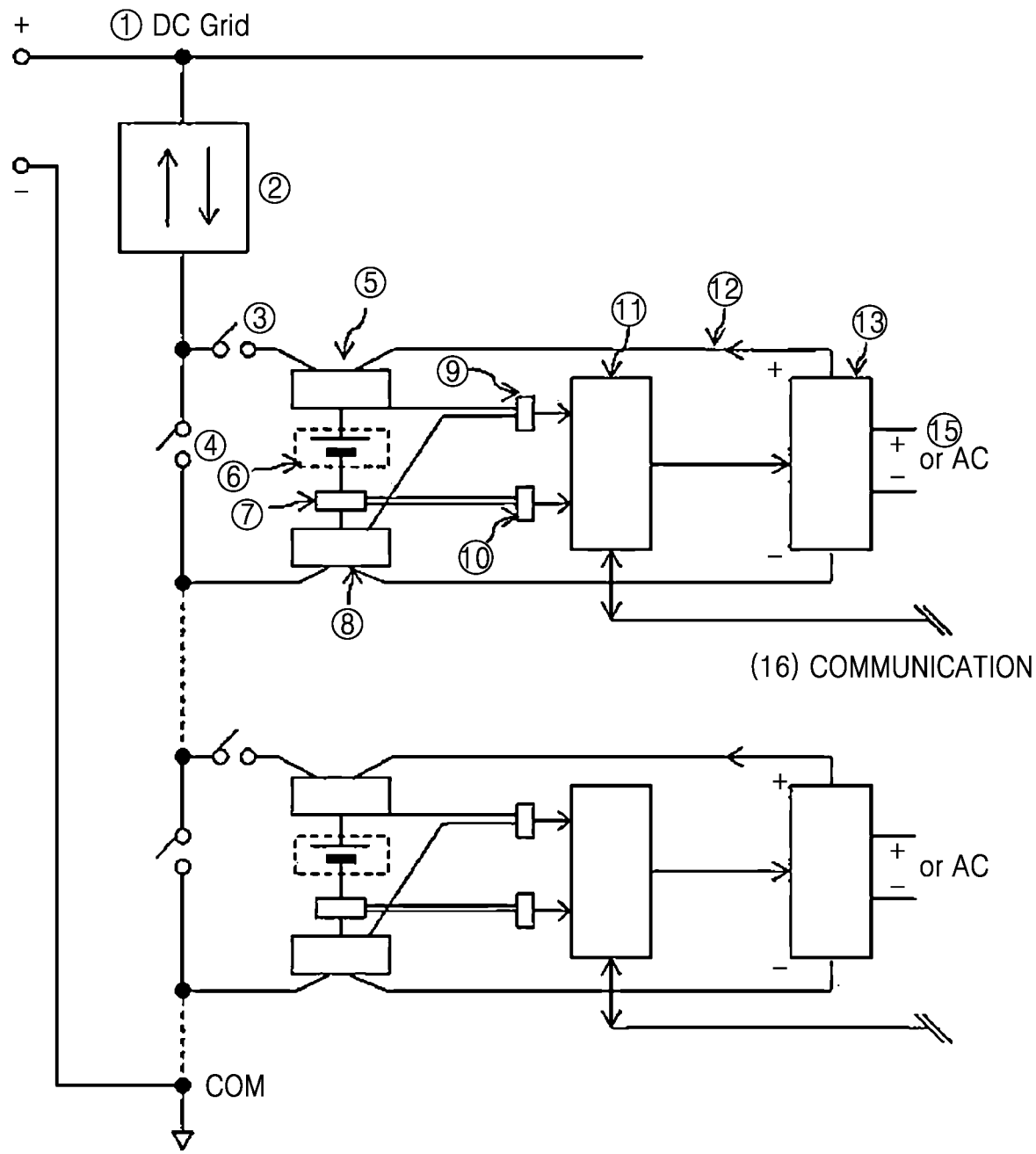
FIG. 1 illustrates a series-type charging and discharging apparatus without current interruption according to the present disclosure.

FIG. 1 illustrates a series-type charging and discharging apparatus without current interruption according to the present disclosure.

Figure 2:
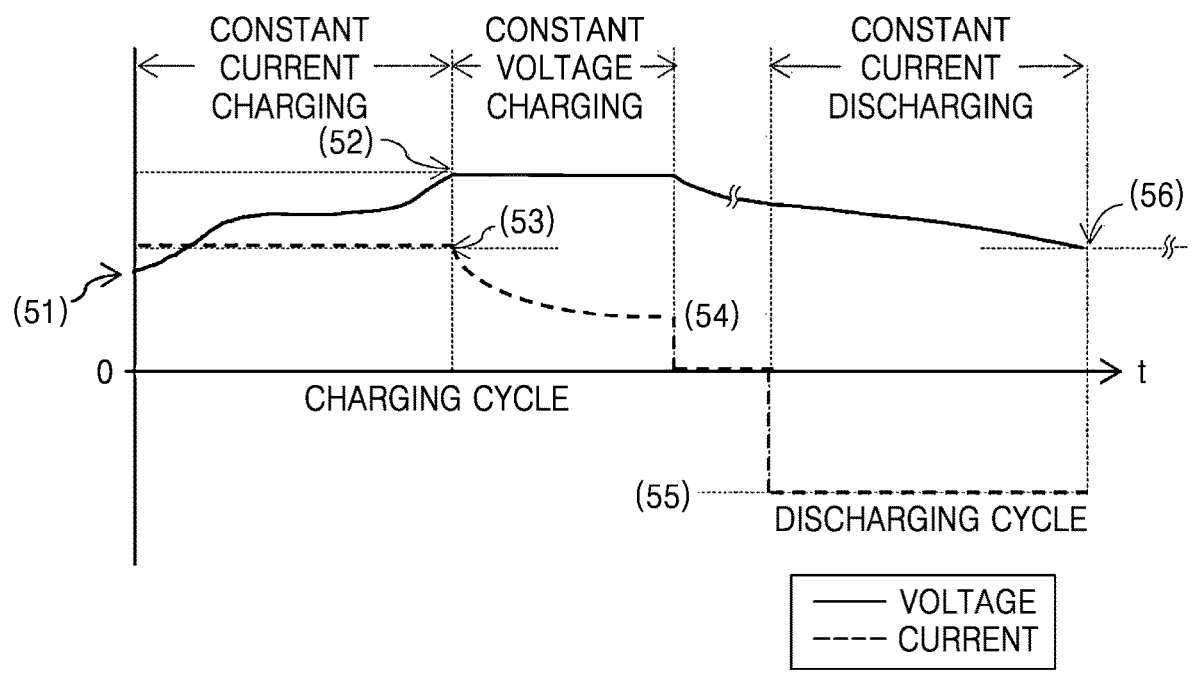
FIG. 2 is a graph showing charge and discharge characteristics of typical secondary batteries.

FIG. 2 is a graph showing charge and discharge characteristics of typical secondary batteries.

Figure 3:
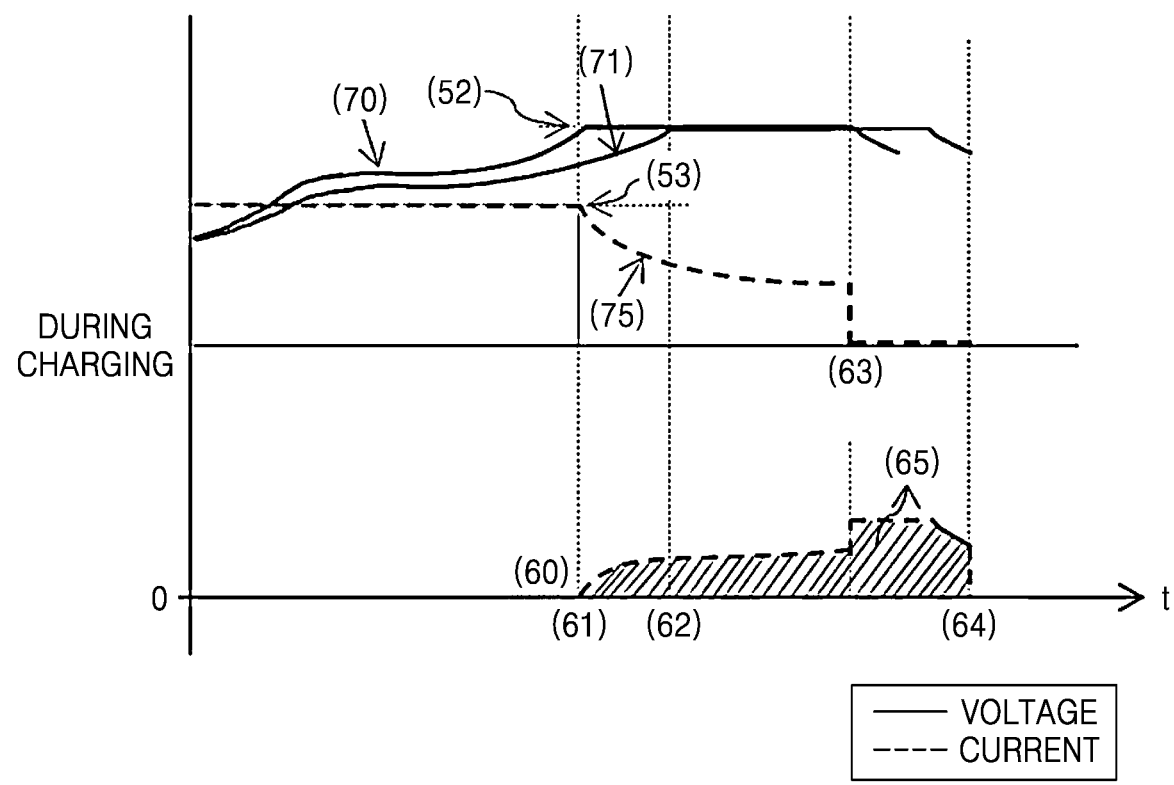
FIG. 3 is a graph showing charge characteristics of secondary batteries having a capacity difference according to the present disclosure.

FIG. 3 is a graph showing charge characteristics (recipe and profile) of secondary batteries having a capacity difference according to the present disclosure.

Figure 4:
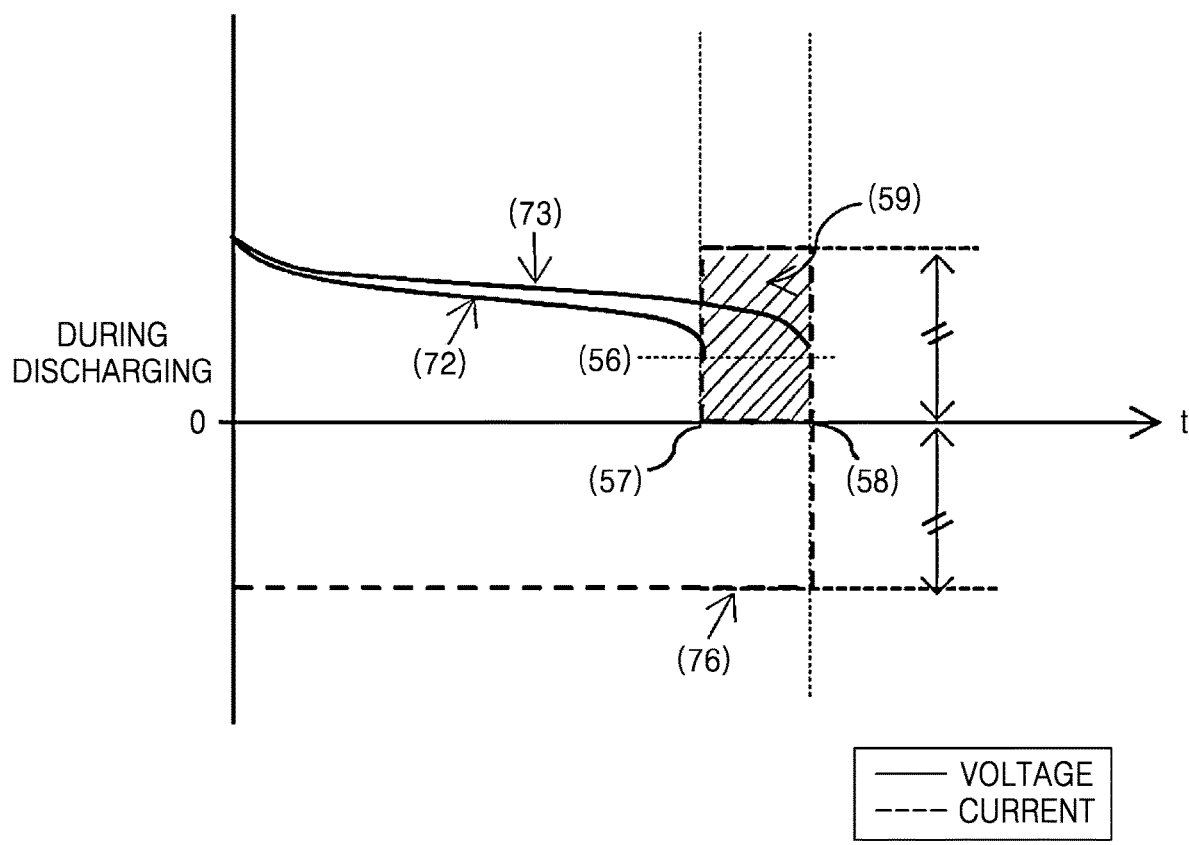
FIG. 4 is a graph showing discharge characteristics of secondary batteries having a capacity difference according to the present disclosure.

FIG. 4 is a graph showing discharge characteristics (recipe and profile) of secondary battery having a capacity difference according to the present disclosure.

The present disclosure relates to a series-type charging and discharging method and apparatus without current interruption in which a plurality of secondary batteries connected in series are charged and discharged using one bi-directional main charging and discharging power supply without a charging or discharging current interruption phenomenon (for example, relay on/off) of a battery, and thus an operating voltage of the main charging and discharging apparatus is n times higher than a voltage of one battery, wherein n is the number of batteries, to increase power conversion efficiency, thereby reducing equipment costs and operation costs.

In the specification of the present disclosure, since series-type charging and discharging of the present disclosure includes a predetermined hardware configuration and a configuration obtained by a microprocessor executing a control program loaded in a memory, the expression "operation and/or configuration" means that that both a method invention and an apparatus invention are included.

As shown in FIG. 2, a typical secondary battery is charged in two modes of constant current and constant voltage charging modes and is discharged in only a constant current discharging mode.

In FIG. 2, a series-type charging and discharging method and apparatus includes an operation and/or a configuration in which, when the battery is charged with a predetermined constant current 53 (see FIG. 2) before being charged, an initial voltage 51 (see FIG. 2) of the battery gradually is increased to reach a predetermined maximum voltage 52 (see FIG. 2) (for example, 4,200 mV).

The series-type charging and discharging method and apparatus includes an operation in which, from then on, when, while a voltage of the battery is maintained at the maximum voltage 52 (see FIG. 2), a charging current is gradually decreased to reach a predetermined cutoff current 54, a charging cycle is completed.

In FIG. 2, in a discharging process, the battery starts to be discharged at a predetermined constant current 55 (see FIG. 2), and when the voltage of the battery is gradually decreased to reach a predetermined cutoff voltage 56 (see FIG. 2) (for example, 2,800 mV), a discharging cycle is completed.

Next, a series-type charging and discharging apparatus without current interruption according to the present disclosure will be described with reference to FIG. 1.

According to the present disclosure, a series-type charging/discharging apparatus and method includes a configuration and an operation in which a plurality of secondary batteries connected in series are charged and discharged using one bi-directional main charging and discharging power supply, and an auxiliary charging power supply is additionally installed in parallel to each of individual batteries to correct (or supplement) a capacity difference between the individual batteries.

According to the present disclosure, a plurality of secondary batteries connected in series are charged and discharged using one bi-directional main charging and discharging power supply. Such a configuration has (1) an effect in which the number of charging and discharging apparatuses is reduced to one to reduce an installation space and equipment costs and (2) an effect in which an operating voltage of a main charging and discharging supply is n times higher than a voltage of one battery, wherein n is the number of batteries connected in series, and thus power conversion efficiency is increased to reduce operation costs.

In addition, according to the present disclosure, there is a need for the following apparatus and method for (3) compensating for a capacity difference between individual batteries and (4) preventing an interruption (on/off) phenomenon of a battery charging and discharging current.

An auxiliary charging power supply provided for the purpose of correcting a capacity difference between individual batteries according to the present disclosure is an insulated unidirectional DC-to-DC converter that uses a power source of a DC grid, which is an input terminal of a main charging and discharging power supply or separate external power as an input and uses a voltage of an individual battery as an output.

An auxiliary charging power supply according to the present disclosure supplements a charging current for a battery with large capacity in a charging process of individual batteries connected in series and supplements a discharging current for a battery with small capacity in a discharging process thereof.

In addition, an auxiliary charging power supply according to the present disclosure may be configured as a high-frequency switching power supply and may have a configuration in which a control program designed and manufactured to minimize power loss is loaded in a memory and executed by a microprocessor or the like to perform precise control.

A series-type charging and discharging method and apparatus without current interruption according to the present disclosure will be described with reference to FIG. 1.

According to the present disclosure, a high-voltage DC power source for suppling power to the series-type charging and discharging apparatus, that is, a DC grid ① having a voltage higher than the sum of voltages of all connected batteries, is configured to supply a DC within a predetermined voltage range (for example, a range of a minimum of 300 VDC to a maximum of 350 VDC). When the voltage of the DC grid exceeds the maximum voltage in a discharging process, the DC grid is controlled to transmit power to a common AC power grid (national power supply network) and maintain the predetermined voltage range.

A bi-directional main charging/discharging power supply ② is configured to serve as a current source for performing a function of charging and discharging a plurality of secondary batteries connected in series below according to a charging and discharging recipe (see FIG. 2).

Individual batteries ⑥ are connected or separated through bi-directional connection relays ③ and bypass relays ④ to be connected to an overall circuit, and in this case, in a common method (existing method), interruption (on/off) of a main current is generated by a relay element or the like.

At a moment when the relay element operates, interruption (on/off) of a current of the main charging and discharging power supply may be temporarily generated, and errors may occur in the current and voltage measurement.

A battery voltage ⑨ is detected with a positive grip ⑤ and a negative grip ⑧ which connect a battery, and a current signal ⑩ flowing to an actual battery ⑥ is detected by a current sensor ⑦ connected in series and is provided as an input signal of a battery controller ⑪ which is controlled by a microprocessor or the like.

The battery controller ⑪ is configured to exchange charging and discharging information with a host controller through bi-directional communication 16 and execute a charging and discharging control program according to the present disclosure loaded in a memory using a microprocessor, thereby performing precise control by interworking with the host controller.

An auxiliary charging power supply ⑬ according to the present disclosure may be powered by separate external power ⑮, and power of the DC grid ① may be used or separate AC power may be used.

The auxiliary charging power source ⑬ supplements a predetermined current ⑫ to the individual battery ⑥ under control of the battery controller ⑪ to allow charging and discharging to be performed according to a charging and discharging recipe.

Since the required number of charging and discharging batteries are connected in series to obtain a high voltage by n times, wherein n is the number of batteries, due to series connection as compared with a case in which one battery is connected (parallel connection), a battery connection apparatus according to the present disclosure may have high power conversion efficiency, thereby obtaining an enhanced effect of reducing operation costs. A charging and discharging circuit is simplified due to charging and discharging by one bi-directional main charging and discharging power supply ②, thereby obtaining an advantageous effect of reducing equipment costs.

Next, charge characteristics of secondary batteries having a capacity difference will be described with respect to FIG. 3.

A series-type charging and discharging method and apparatus includes an operation or a configuration in which, in a charging cycle of FIG. 2, batteries having a capacity difference are connected in series and charged using one main charging and discharging power supply ② (see FIG. 1), and charging based on a "battery with the smallest capacity" is performed according to a current pattern 75 of FIG. 3 (see FIG. 3).

In this case, since a battery with relatively large capacity has not yet reached a maximum voltage 52 (see FIG. 3), the series-type charging and discharging method and apparatus includes an operation or a configuration in which an auxiliary charging power supply ⑬ (see FIG. 1) supplies the battery with current as much as a deficit 65 to (see FIG. 3) so as to perform replenishment charging.

The series-type charging and discharging method and apparatus includes an operation or a configuration in which, when the "battery with the smallest capacity" is fully charged, the main charging power supply ② stops a charging function, and a battery controller ⑪ (see FIG. 1) of a corresponding battery may complete a charging cycle of batteries with relatively large capacities using an auxiliary charging power supply.

In the series-type charging and discharging method and apparatus according to the present disclosure, through such a process, a charging cycle of all batteries connected in series may be completed without interruption of a charging current.

Next, discharge characteristics of secondary batteries having a capacity difference will be described with reference to FIG. 4.

A series-type charging and discharging method and apparatus includes an operation or a configuration in which, in a discharging cycle of FIG. 2, batteries having a capacity difference are connected in series and discharged using one main charging and discharging power supply ②(see FIG. 1), and discharging based on a "battery with the largest capacity" is performed according to a current pattern 76 of FIG. 4.

In this case, the series-type charging and discharging method and apparatus includes an operation or a configuration in which a battery with relatively small capacity first reaches a cutoff voltage 56 (see FIG. 4), and from this time an auxiliary charging power supply ⑬ (see FIG. 1) for a corresponding battery generates a current 59 (FIG. 4) as much as a main discharging current to provide the generated current to a main discharging circuit.

That is, since a current of the corresponding battery becomes zero, it is as if discharging has been completed.

When the "battery with the largest capacity" reaches the cutoff voltage 56 (see FIG. 4), a discharging cycle of all the batteries is completed without current interruption.

The auxiliary charging power supply performs a function of supplementing a charging current for a battery with large capacity in a charging process of batteries connected in series and performs a function of supplementing a discharging current for a battery with small capacity in a discharging process thereof.

The auxiliary charging power supply is configured as a high-frequency switching power supply and has a configuration in which a control program provided according to the present disclosure is loaded in a memory and executed by a microprocessor to perform precise control and minimize power loss. The auxiliary charging power supply is automatically controlled according to a charging and discharging recipe and/or a charging and discharging profile according to the present disclosure and is configured to perform a charging and discharging operation.

According to the present disclosure, a series-type charging and discharging method and apparatus includes an operation or a configuration in which, during a charging or discharging operation, a calibration operation of calibrating a current sensor of a charging and discharging power supply is performed under predetermined conditions according to a high specification current sensor (with high precision) of a main charging and discharging power supply.

More specifically, since a general specification current sensor of an individual battery may be periodically and automatically calibrated according to a high specification current sensor of a main charging and discharging power supply, high specification current sensors may be reduced by a large number, which has an advantageous effect of reducing manufacturing costs.

The series-type charging and discharging method and apparatus includes an operation or a configuration in which the main charging and discharging power supply precisely recognizes an output voltage and current of individual batteries connected in series and concurrently performs charging and discharging by exchanging data necessary for charging and discharging with a microprocessor in which a control program according to the present disclosure is loaded and which is for controlling the individual batteries.

The series-type charging and discharging method and apparatus includes an operation or a configuration in which, when a difference between the sum of voltage values of the individual batteries and an output voltage of the main charging and discharging power supply is recognized as a setting (predetermined) value or more, it is recognized that an abnormality occurs in a charging and discharging circuit.

The series-type charging and discharging method and apparatus includes an operation or a configuration in which it is ideal when the output voltage of the main charging and discharging power supply is the same as the sum of voltages of the individual batteries connected in series or corresponds to a voltage drop at a contact portion (usually several mV or less per individual battery), but in a case in which poor contact occurs in a battery contact portion or a relay contact portion, when a voltage difference is detected as higher than the setting (predetermined) value, it is determined that an abnormality occurs in the charging and discharging circuit, an operation of equipment is stopped, and an warning message is generated and notified so as to take safety precautions.

Since an apparatus for charging and discharging a secondary battery usually handles a very large number of batteries (more than tens of thousands of batteries), it is not easy to modify or upgrade a charge and discharge control program of a control device.

However, in the present disclosure, an operation or a configuration is included in which a program of a controller (one-several tenth of the number of batteries) of a main charging and discharging power supply, which controls a series-type charging and discharging apparatus, is easily modified or upgraded through remote communication (for example, Ethernet or the like), thereby obtaining an enhanced effect.

As used herein, "presetting current profile," "charging recipe," "discharging recipe," and the like are as shown in FIGS. 2, 3, and 4 and described with reference to respective drawings, and such control is performed in such a manner that a battery controller ⑪ (see FIG. 1) and a host controller execute a charge and discharge control program designed and manufactured according to the present disclosure loaded in a memory and interlock with each other to perform precise control.

Next, configurations according to various embodiments of the present disclosure will be described.

According to one embodiment of the present disclosure, a charging and discharging apparatus and method using a bi-directional main charging and discharging power supply includes an operation or a configuration in which a plurality of secondary batteries connected in series are charged and discharged using one bi-directional main charging and discharging power supply, auxiliary charging power supplies are added in parallel to individual batteries to correct a capacity difference between the individual batteries, and a charging and discharging process is continuously performed according to a predetermined recipe (electrical conditions or the like for charging and discharging) without an interruption (on/off) of a charging and discharging current of the main charging and discharging power supply.

In another embodiment of the present disclosure, a charging and discharging apparatus and method includes an operation or a configuration in which an auxiliary charging power supply is configured as an insulated unidirectional switch mode DC-to-DC converter that uses a power source of a DC grid, which is an input terminal of a main charging and discharging power supply, or one of separate DC power and AC power as an electrical input of the auxiliary charging power supply and uses a voltage of an individual battery as an output, and a voltage and current of the individual battery are increased or decreased using the auxiliary charging power supply including a separate battery controller that includes a microcontroller in which a control program loaded.

In still another embodiment of the present disclosure, during series charging, when a main charging and discharging power supply performs charging at a predetermined constant current according to a predetermined charging recipe, a voltage of a "battery with the smallest capacity" first reaches a predetermined setting voltage (or a maximum voltage, for example, 4,200 mV in a lithium battery).

The charging and discharging apparatus and method includes an operation or a configuration in which the main charging and discharging power supply performs constant voltage charging (at a charging current according to a predetermined recipe) based on the "battery with the smallest capacity," and for other batteries with larger capacity than the battery with the smallest capacity, a deficit charging current is supplemented using the auxiliary charging power supply according to a predetermined charging recipe to complete charging of all individual batteries according to a predetermined charging recipe without current interruption (on/off).

In yet another embodiment of the present disclosure, during series discharging or serial discharging, when a main charging and discharging power supply performs discharging at a predetermined constant current according to a predetermined discharging recipe during a discharging cycle based on a "battery with the largest capacity," a voltage of a "battery with the smallest capacity" first reaches a predetermined setting voltage (or a cutoff voltage, for example, 2,800 mV in a lithium battery).

A charging and discharging apparatus and method includes an operation or a configuration in which an auxiliary charging power supply for the "battery with the smallest capacity" supplies a current as much as a current (current in the discharging recipe) of the main charging and discharging power supply (a current of a corresponding battery is "0"), and a discharging operation is performed on each battery according to a capacity difference to complete discharging of all batteries according to a predetermined discharging recipe without current interruption (on/off).

In yet another embodiment of the present disclosure, a charging and discharging apparatus and method includes an operation or a configuration in which charging is performed only in a predetermined constant current charging section during charging, and in a constant voltage charging section, an auxiliary charging power supply for an individual battery controls a charging current according to a predetermined charging recipe.

In yet another embodiment of the present disclosure, a charging and discharging apparatus and method includes an operation or a configuration in which a main charging and discharging power supply with relatively higher power conversion efficiency than an auxiliary charging power supply for an individual battery is first used, in order to simplify a control function, the main charging and discharging power supply performs charging at a predetermined constant current in a predetermined constant current charging section during charging and performs charging according to a presetting current profile in a constant voltage charging section, and an auxiliary charging power supply for the individual battery performs control such that a charging current is supplemented as much as the difference between a current set in a charging recipe and the actual current according to a predetermined charging recipe.

A person skilled in the art will be able to easily understand various protection scopes of a series-type charging and discharging method and apparatus without current interruption based on the technical configuration described above.

First, the protection scope of the present disclosure for a series-type charging and discharging method without current interruption will be described.

According to one embodiment of the present disclosure, a series-type charging and discharging method without current interruption using a bi-directional main charging and discharging power supply includes an operation in which a plurality of secondary batteries connected in series are charged and discharged using one bi-directional main charging and discharging power supply and are continuously charged and discharged according to a predetermined recipe without interruption of a charging and discharging current of the main charging and discharging power supply.

In another embodiment of the present disclosure, the series-type charging and discharging method includes an operation in which auxiliary charging power supplies are installed in parallel to individual batteries connected in series to correct a capacity difference between the secondary batteries connected in series.

In still another embodiment of the present disclosure, the series-type charging and discharging method includes an operation in which the auxiliary charging power supply is configured as an insulated unidirectional switch mode DC-to-DC converter that uses a power source of a DC grid, which is an input terminal of the main charging and discharging power supply, or one of separate DC power and AC power as an electrical input of the auxiliary charging power supply and uses a voltage of the individual battery as an output, and the capacity difference between the plurality of secondary batteries connected in series is corrected.

In yet another embodiment of the present disclosure, the series-type charging and discharging method includes an operation in which a control program is loaded in the auxiliary charging power supply and executed by a microcontroller to increase or decrease a voltage and current of the individual battery using each battery controller configured to control charging and discharging of each individual battery.

In yet another embodiment of the present disclosure, the series-type charging and discharging method includes an operation in which, during series charging, when the main charging and discharging power supply performs charging at a predetermined constant current according to a predetermined charging recipe, a voltage of a battery with the smallest capacity first reaches a predetermined voltage among batteries connected in series, and in series-type charging and discharging, the main charging and discharging power supply performs constant voltage charging based on the battery with the smallest capacity.

In yet another embodiment of the present disclosure, the series-type charging and discharging method includes an operation in which, for other batteries with larger capacity than the battery with the smallest capacity, a deficit charging current is supplemented using the auxiliary charging power supply according to a predetermined charging recipe to complete charging of all the individual batteries without current interruption.

In yet another embodiment of the present disclosure, the series-type charging and discharging method includes an operation in which, during series discharging, the main charging and discharging power supply performs discharging at a predetermined constant current according to a predetermined discharging recipe during a discharging cycle based on a battery with the largest capacity among the plurality of batteries connected in series.

In yet another embodiment of the present disclosure, the series-type charging and discharging method includes an operation in which a voltage of the battery with the smallest capacity first reaches a predetermined setting voltage among the plurality of batteries connected in series, the auxiliary power charging power supply for the battery with the smallest capacity supplies a current as much as a current of the main charging and discharging power supply.

In yet another embodiment of the present disclosure, the series-type charging and discharging method includes an operation in which such a procedure is repeated on the plurality of batteries connected in series in order of sizes of capacity to complete discharging of all the batteries according to a setting (predetermined) discharging recipe without current interruption.

In yet another embodiment of the present disclosure, the series-type charging and discharging method includes an operation in which, during charging, the main charging and discharging power supply performs charging only in a predetermined constant current charging section based on the battery with the smallest capacity, and in a constant voltage charging section, the auxiliary charging power supply for the individual battery controls a charging current according to a predetermined charging recipe.

In yet another embodiment of the present disclosure, the series-type charging and discharging method includes an operation in which the main charging and discharging power supply with relatively higher power conversion efficiency than the auxiliary charging power supply for the individual battery is used, and in order to simplify a control function, the main charging and discharging power supply performs charging at a predetermined constant current in a predetermined constant current charging section during charging based on the battery with the smallest capacity.

In yet another embodiment of the present disclosure, the series-type charging and discharging method includes an operation in which charging is performed according to a presetting current profile in a constant voltage charging section, and the auxiliary charging power supply for the individual battery performs control such that a charging current is supplemented as much as the difference between a current set in the charging recipe and the actual current according to a predetermined charging recipe.

In yet another embodiment of the present disclosure, the series-type charging and discharging method includes an operation in which a current sensor of the auxiliary charging power supply and a current sensor of the main charging and discharging power supply exchange measured values with each other to automatically or periodically calibrate the sensors themselves and measure currents of the individual batteries to precisely correct a capacity difference between the plurality of secondary batteries connected in series.

In yet another embodiment of the present disclosure, the series-type charging and discharging method includes an operation in which an output voltage of the main charging and discharging power supply is compared with the sum of voltages of the individual batteries, and when a voltage difference is greater than a setting voltage due to a voltage drop caused by contact resistance, in order to increase safety, it is recognized in advance that the battery or a contact portion is defective, and an operation is stopped, or a warning message for preventive measures is sent.

In yet another embodiment of the present disclosure, a series-type charging and discharging method without current interrupt in which a plurality of secondary batteries are connected in series includes an operation in which a charging and discharging program of one main charging and discharging controller is easily modified or upgraded through remote communication.

Next, the protection scope of the present disclosure for a series-type charging and discharging apparatus without current interruption will be described.

A series-type charging and discharging apparatus without current interruption using a bi-directional main charging and discharging power supply has a configuration in which a plurality of secondary batteries connected in series are charged and discharged using one bi-directional main charging and discharging power supply and are continuously charged and discharged according to a predetermined recipe without interruption of a charging and discharging current of the main charging and discharging power supply.

In another embodiment of the present disclosure, auxiliary charging power supplies are installed in parallel to individual batteries connected in series to compensate for a capacity difference between the plurality of secondary batteries connected in series.

In still another embodiment of the present disclosure, the series-type charging and discharging apparatus has a configuration in which the auxiliary charging power supply is configured as an insulated unidirectional switch mode DC-to-DC converter that uses a power source of a DC grid, which is an input terminal of the main charging and discharging power supply, or one of separate DC power and AC power as an electrical input of the auxiliary charging power supply and uses a voltage of the individual battery as an output.

In yet another embodiment of the present disclosure, the auxiliary charging power supply is configured to increase or decrease a voltage and current of the individual battery using a battery controller of each individual battery having a configuration in which a control program is loaded in the auxiliary charging power supply and executed by a microcontroller to precisely control charging and discharging of each of the individual batteries.

In yet another embodiment of the present disclosure, the series-type charging and discharging apparatus has a configuration in which, during series charging, when the main charging and discharging power supply performs charging at a predetermined constant current according to a predetermined charging recipe, a voltage of a battery with the smallest capacity first reaches a predetermined voltage among batteries connected in series, and the main charging and discharging power supply performs constant voltage charging based on the battery with the smallest capacity.

In yet another embodiment of the present disclosure, for other batteries with larger capacity than the battery with the smallest capacity, a deficit charging current is supplemented using the auxiliary charging power supply according to a predetermined charging recipe to complete charging of all the individual batteries without current interruption.

In yet another embodiment of the present disclosure, during series discharging, the main charging and discharging power supply is configured to perform discharging at a predetermined constant current according to a predetermined discharging recipe during a discharging cycle based on a battery with the largest capacity among the plurality of batteries connected in series, and among the plurality of batteries connected in series, a voltage of the battery with the smallest capacity first reaches a predetermined setting voltage, and the auxiliary charging power supply for the battery with the smallest capacity is configured to supply a current as much as a current of the main charging and discharging power supply.

In yet another embodiment of the present disclosure, such a procedure is repeated on the plurality of batteries connected in series in order of sizes of capacity to complete discharging of all the batteries according to a predetermined discharging recipe without current interruption.

In yet another embodiment of the present disclosure, the main charging and discharging power supply performs charging only in a predetermined constant current charging section during charging, and in a constant voltage charging section, the auxiliary charging power supply for the individual battery controls a charging current according to a predetermined charging recipe.

In yet another embodiment of the present disclosure, the main charging and discharging power supply with relatively higher power conversion efficiency than the auxiliary charging power supply for the individual battery is used, and in order to simplify a control function, the main charging and discharging power supply is configured to perform charging at a predetermined constant current in a predetermined constant current charging section during charging.

In yet another embodiment of the present disclosure, the series-type charging and discharging apparatus has a configuration in which charging is performed according to a presetting current profile in a constant voltage charging section, and the auxiliary charging power supply for the individual battery performs control such that a charging current is supplemented as much as the difference between a current set in the charging recipe and the actual current according to a predetermined charging recipe.

In yet another embodiment of the present disclosure, the series-type charging and discharging apparatus has a configuration in which a current sensor of the auxiliary charging power supply and a current sensor of the main charging and discharging power supply exchange measured values with each other to automatically or periodically calibrate the sensors themselves and measure currents of the individual batteries to precisely correct a capacity difference between the plurality of secondary batteries connected in series.

In yet another embodiment of the present disclosure, the series-type charging and discharging apparatus has a configuration in which an output voltage of the main charging and discharging power supply is compared with the sum of voltages of the individual batteries, and when a voltage difference is greater than a setting voltage due to a voltage drop caused by contact resistance, in order to increase safety, it is recognized in advance that the battery or a contact portion is defective, and an operation is stopped, or preventive measures are taken.

In yet another embodiment of the present disclosure, in a series-type charging and discharging method without current interrupt in which a plurality of secondary batteries are connected in series, a charging and discharging program of one main charging and discharging controller may be easily modified or upgraded through remote communication.

In addition to the above described protection scope, the protection scope of the present disclosure may be variously determined based on the above-described contents as needed.

INDUSTRIAL APPLICABILITY

The present disclosure provides a method and apparatus for charging and discharging a plurality of secondary batteries connected in series using one bi-directional main charging and discharging power supply and provides a series-type charging and discharging method and apparatus without current interruption in which auxiliary charging power supplies are added in parallel to individual batteries to reduce a capacity difference between the individual batteries and perform continuous charging and discharging according to a predetermined recipe without interruption (on/off) of a charging or discharging current of the main charging and discharging power supply, which may reduce equipment costs and operation costs, and thus the present disclosure possesses very high industrial applicability.

EXPLANATION OF REFERENCE NUMERALS DESIGNATING THE MAJOR ELEMENTS OF THE DRAWINGS

| | |
|---|---|
| ①: DC grid | ②: bi-directional main charging and discharging power supply |
| ③: bi-directional connection relay | ④: bypass relay |
| ⑤: positive electrode grip | ⑥: individual battery |
| ⑦: current sensor | ⑧: negative electrode grip |
| ⑨: battery voltage | ⑩: current signal |
| ⑪: battery controller | ⑫: predetermined current |
| ⑬: auxiliary charging power supply | ⑮: external power |
| (16): bi-directional communication | |
| 51: initial voltage of battery | 52: maximum voltage |
| 53: predetermined constant current of battery before charging | 54: predetermined cutoff current |
| 55: constant current | 56: cutoff voltage |
| 65; current as much as deficit | |
| 75: current pattern tailored to battery | 76: current pattern tailored to battery |

The invention claimed is:

1. A series-type charging and discharging apparatus without current interruption, in which the series-type charging and discharging apparatus has no current interruption by using a bi-directional main charging and discharging power supply, wherein
a plurality of secondary batteries connected in series are charged and discharged using one bi-directional main charging and discharging power supply, and
are continuously charged and discharged according to a charging and discharging recipe without interruption of a charging and discharging current of the main charging and discharging power supply,
wherein auxiliary charging power supplies are additionally installed in parallel to individual batteries connected in series to compensate for a capacity difference between a plurality of secondary batteries connected in series,
wherein each of the auxiliary charging power supplies is configured as an insulated unidirectional switch mode DC-to-DC converter which uses a power source of a DC grid, which is an input terminal of the main charging and discharging power supply, or one of separate DC power and AC power as an electrical input and uses a voltage of the individual battery as an output to compensate for a capacity difference between a plurality of secondary batteries connected in series,
wherein each of the auxiliary charging power supplies performs a function of supplementing a charging current for a battery with large capacity in a charging process of batteries connected in series and performs a function of supplementing a discharging current for a battery with small capacity in a discharging process of batteries connected in series.

2. The series-type charging and discharging apparatus of claim 1, wherein the auxiliary charging power supply increases or decreases a voltage and a current of the individual battery using each battery controller having a configuration that a control program is loaded in the auxiliary charging power supply and executed by a microcontroller to control charging and discharging of the individual battery.

3. The series-type charging and discharging apparatus of claim 2, wherein, during series charging, when a main charging and discharging power supply performs charging at a predetermined constant current according to a predetermined charging recipe, a voltage of a secondary battery having a smallest capacity among secondary batteries connected in series first reaches a predetermined setting voltage, and the main charging and discharging power supply is configured to perform constant voltage charging based on the secondary battery having the smallest capacity.

4. The series-type charging and discharging apparatus of claim 2, wherein, for other batteries having larger capacity than a secondary battery having a smallest capacity, a charging current is supplemented as much as the difference between a current set in the charging recipe and the actual current according to a predetermined charging recipe by the auxiliary charging power supply to complete charging of all the individual batteries without current interruption.

5. The series-type charging and discharging apparatus of claim 1, wherein, during series discharging, a main charging and discharging power supply is configured to perform discharging at a predetermined constant current according to a predetermined discharging recipe during a discharging cycle based on a secondary battery having a largest capacity among the plurality of secondary batteries connected in series.

6. The series-type charging and discharging apparatus of claim 5, wherein, among the plurality of secondary batteries connected in series, a voltage of a secondary battery having a smallest capacity first reaches a predetermined setting voltage, and the auxiliary charging power supply for the secondary battery having the smallest capacity is configured to supply a current as much as a current of the main charging and discharging power supply.

7. The series-type charging and discharging apparatus of claim 5, wherein the procedures according to claim 5 are repeated on the plurality of secondary batteries connected in series in order of sizes of capacity to complete discharging of all the secondary batteries according to a predetermined discharging recipe without current interruption.

8. The series-type charging and discharging apparatus of claim 1, wherein a main charging and discharging power supply is configured to perform charging only in a predetermined constant current charging section based on a secondary battery having a smallest capacity during charging, and in a constant voltage charging section, the auxiliary charging power supply for the individual battery is configured to control a charging current according to a predetermined charging recipe.

9. The series-type charging and discharging apparatus of claim 1, wherein a main charging and discharging power supply with relatively higher power conversion efficiency than the auxiliary charging power supply for the individual battery is used, and in order to simplify a control function, the main charging and discharging power supply performs charging at a predetermined constant current in a predetermined constant current charging section based on a secondary battery having smallest capacity during charging, wherein, in a constant voltage charging section, charging is performed according to a setting current profile, and the auxiliary charging power supply for the individual battery performs control such that a charging current is supplemented as much as the difference between a current set in the charging recipe and the actual current according to a predetermined charging recipe.

* * * * *